United States Patent
Jung

(10) Patent No.: US 8,324,624 B2
(45) Date of Patent: Dec. 4, 2012

(54) THIN FILM TRANSISTOR ARRAY SUBSTRATE FOR AN X-RAY DETECTOR AND METHOD OF FABRICATING THE SAME

(75) Inventor: Kwan-Wook Jung, Suwon-si (KR)

(73) Assignee: Samsung Display Co., Ltd. (KR)

( * ) Notice: Subject to any disclaimer, the term of this patent is extended or adjusted under 35 U.S.C. 154(b) by 75 days.

(21) Appl. No.: 12/647,352

(22) Filed: Dec. 24, 2009

(65) Prior Publication Data

US 2010/0163882 A1 Jul. 1, 2010

(30) Foreign Application Priority Data

Dec. 26, 2008 (KR) ........................ 10-2008-0134753

(51) Int. Cl.
*H01L 31/08* (2006.01)
(52) U.S. Cl. ....... 257/59; 257/72; 257/350; 257/E31.04; 257/E31.092; 438/149; 438/154; 438/158
(58) Field of Classification Search .................... 257/59, 257/72, 66, 347, 350, E31.04, E31.092; 438/59, 438/149, 151, 154, 158, 159, 164
See application file for complete search history.

(56) References Cited

U.S. PATENT DOCUMENTS

| 2002/0076844 A1* | 6/2002 | Possin et al. ..................... 438/30 |
| 2003/0201396 A1* | 10/2003 | Lee ........................... 250/370.09 |
| 2008/0237474 A1* | 10/2008 | Tonotani et al. ......... 250/363.01 |
| 2009/0026509 A1* | 1/2009 | Hayashi et al. ................ 257/292 |
| 2009/0108209 A1* | 4/2009 | Jung et al. ................ 250/370.11 |
| 2009/0280606 A1* | 11/2009 | Shih et al. ..................... 438/155 |

FOREIGN PATENT DOCUMENTS

| JP | 1994-087939 | 12/1994 |
| JP | 07-236025 | 9/1995 |
| JP | 09-064404 | 3/1997 |
| KR | 10-2003-0017875 A | 3/2003 |

* cited by examiner

*Primary Examiner* — Davienne Monbleau
*Assistant Examiner* — Fazli Erdem
(74) *Attorney, Agent, or Firm* — Innovation Counsel LLP

(57) ABSTRACT

A thin film transistor (TFT) array substrate for an X-ray detector and a method of fabricating the same are provided. The TFT array substrate includes a substrate, a gate line formed on the substrate, a data line crossing the gate line, a thin film transistor including a gate electrode, a source electrode, and a drain electrode, a first electrode connected to the drain electrode, a passivation layer formed over the gate line, the data line, the thin film transistor and the first electrode, a photoconductor formed over the passivation layer and connected to the first electrode, and a second electrode formed on the photoconductor.

20 Claims, 12 Drawing Sheets

THIN FILM TRANSISTOR ARRAY SUBSTRATE FOR AN X-RAY DETECTOR AND METHOD OF FABRICATING THE SAME

CROSS-REFERENCE TO RELATED APPLICATION

This application claims priority from Korean Patent Application No. 10-2008-0134753 filed on Dec. 26, 2008 in the Korean Intellectual Property Office, the disclosure of which is incorporated herein by reference in its entirety.

BACKGROUND OF THE INVENTION

1. Field of the Invention

The present invention relates to a thin film transistor (TFT) array substrate for an X-ray detector and a method of fabricating the same, and more particularly, to an X-ray detector having improved sensitivity.

2. Description of the Related Art

In the X-ray diagnostic detection technique, widely used in the medical field, X-ray film is used as a medium for detecting X-rays to produce photographic images, and time consuming film-processing procedures are required to obtain the results. However, recently developed semiconductor techniques have increasingly advanced digital X-ray imaging devices. Digital X-ray detectors employing thin film transistors as switching elements have the significant advantage of providing real time imaging that speeds diagnosis.

An X-ray detector is provided with a TFT array on a TFT array substrate. Unlike a liquid crystal display (LCD), however, the X-ray detector is provided with a positive-intrinsic-negative ("PIN") photodiode array having pixels, each pixel including a silicon layer doped with p-type impurities, an undoped silicon layer, a silicon layer doped with n-type impurities, and two electrodes for applying voltages to opposite ends of the silicon layers. The X-ray detector is different from the LCD where images are displayed by image signals externally applied and transmitted to a pixel electrode. In the X-ray detector, electrons generated from the PIN photodiode using externally induced X-rays are transmitted outside by applying a bias voltage to convert light into electric signals.

An ideal X-ray detector must have maximum sensitivity for recognizing light. Increasing the fill factor, the ratio of the area of the pixel sensitive to light, is limited by conventional design rules of the X-ray detector. Therefore, in order to increase the light sensitivity by increasing the fill factor of the X-ray detector, new design rules are desired. Further, the fill factor may be defined as the ratio of the area of the PIN diode to the area of the pixel area.

SUMMARY OF THE INVENTION

The present invention provides an X-ray detector having improved sensitivity by increasing the fill factor of the X-ray detector.

The present invention also provides a method of fabricating an X-ray detector having improved sensitivity by increasing the fill factor of the X-ray detector.

The above and other objects of the present invention will be described in or be apparent from the following descriptions of the preferred embodiments.

One embodiment of the present invention, includes a thin film transistor (TFT) array substrate for an X-ray detector, the TFT array substrate including a substrate, a gate line formed on the substrate, a data line crossing the gate line, a thin film transistor including a gate electrode, a source electrode, and a drain electrode, a first electrode connected to the drain electrode, a passivation layer formed over the gate line, the data line, the thin film transistor and the first electrode, a photoconductor formed over the passivation layer and connected to the first electrode, and a second electrode formed on the photoconductor.

The present invention also includes a method of fabricating a thin film transistor (TFT) array substrate for an X-ray detector, the method including providing a substrate, forming a gate line and a gate electrode on the substrate, forming a data line crossing the gate line, the source electrode, and the drain electrode on the substrate, forming a first electrode on the substrate to be connected to the drain electrode, forming a passivation layer over the gate line, the data line, the source electrode, the drain electrode, and the first electrode, forming a first contact hole on the passivation layer, forming a photoconductor over the passivation layer and the first electrode that is exposed by the first contact hole, and forming a second electrode on the photoconductor.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
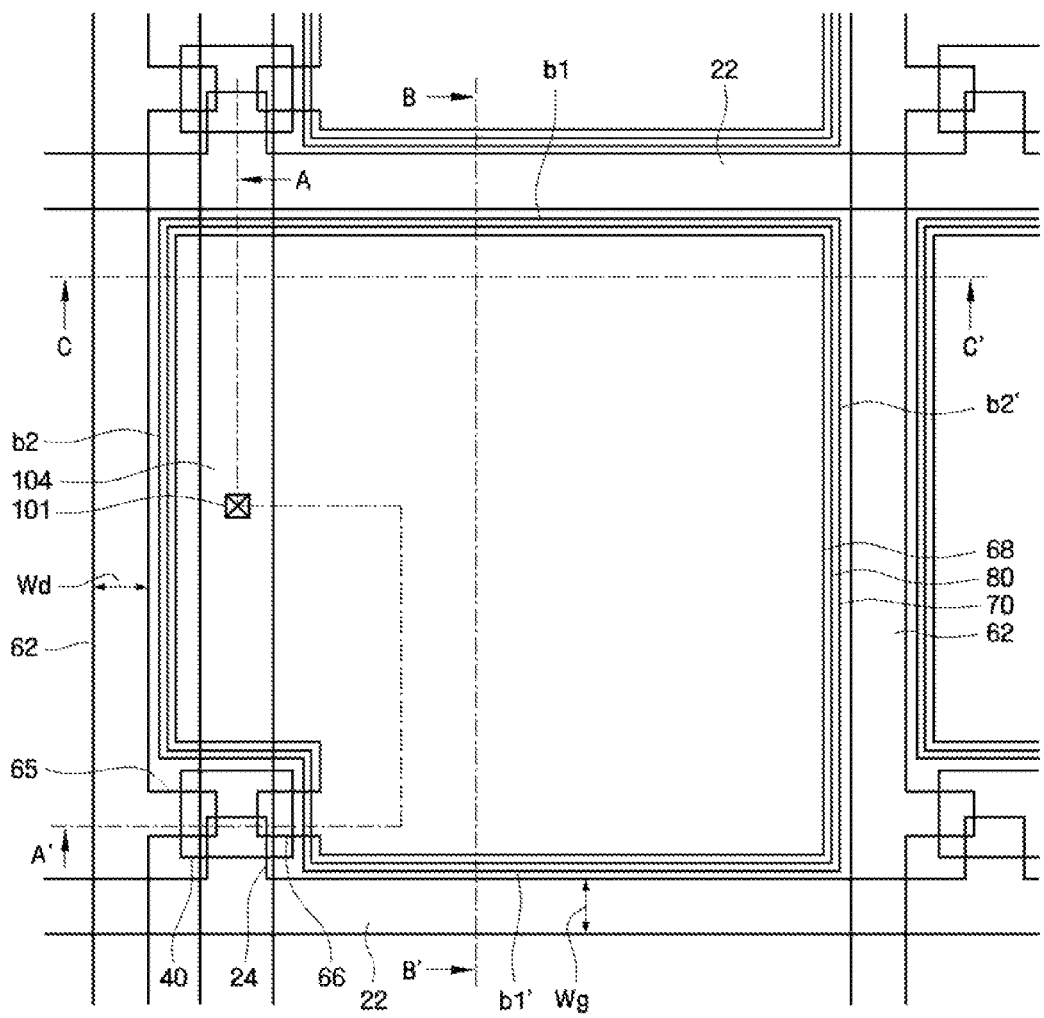
FIG. 1 is a layout view of a TFT array substrate for an X-ray detector according to one embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the same or similar elements are denoted by the same or similar reference numerals even though they are depicted in different figures. In the drawings, the thicknesses of layers and regions are exaggerated for clarity.

When an element or layer is referred to as being "on" another element or layer, it can be directly on the other element or layer or intervening elements or layers may be present. In contrast, when an element or layer is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments of the present invention are described herein with reference to layout views, intermediate structures and cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing.

Hereinafter, TFT array substrates for an X-ray detector according to embodiments of the present invention are described in detail with reference to accompanying drawings.

Figure 2:
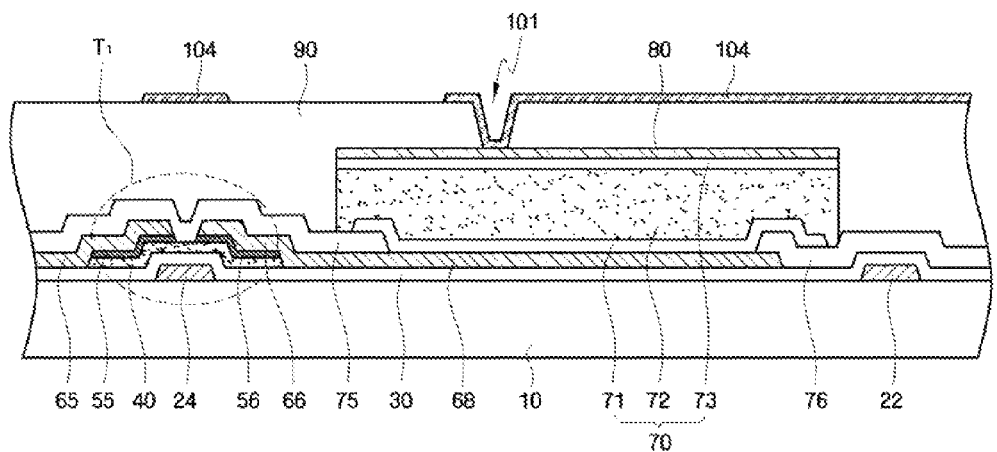
FIG. 2 is a cross-sectional view taken along line A-A' of FIG. 1.
Figure 3:
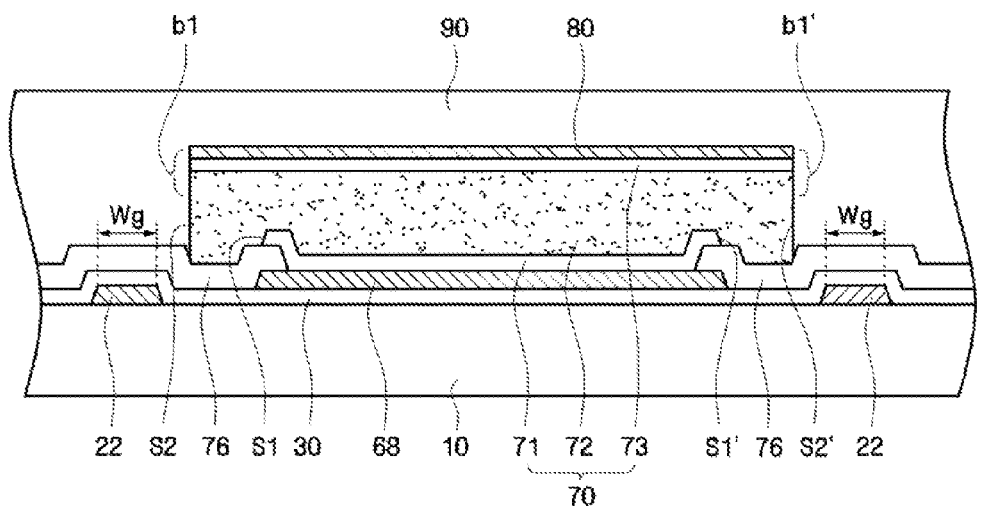
FIG. 3 is a cross-sectional view taken along line B-B' of FIG. 1.
Figure 4:
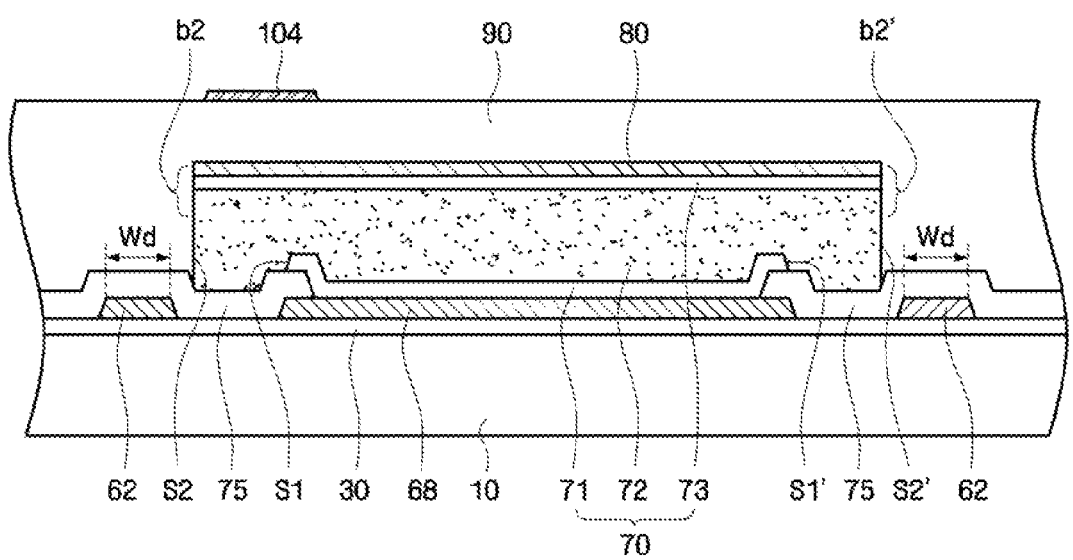
FIG. 4 is a cross-sectional view taken along line C-C' of FIG. 1.

A TFT array substrate for an X-ray detector according to one embodiment of the present invention will be described with reference to FIGS. 1 through 4. FIG. 1 is a layout view of a TFT array substrate for an X-ray detector, FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 through 4, the TFT array substrate for an X-ray detector includes a substrate 10, a gate interconnection (22, 24), a data interconnection (62, 65 and 66), a thin film transistor $T_1$, a first electrode 68, passivation layers (75, 76), a photoconductor 70, and a second electrode 80.

The substrate 10 is a base of the TFT array substrate for an X-ray detector, and is made of an insulating material such as glass, quartz or plastic to prevent an internal electrical short circuit.

A gate interconnection (22, 24) is formed on the substrate 10. The gate interconnection includes a gate line 22 and a gate electrode 24 of the TFT array substrate. Here, the gate electrode 24 is connected to the gate line 22. In addition, the gate interconnection (22, 24) may include a gate pad (not shown). The gate pad receives a signal applied from the outside. Also, the gate pad is connected to an end portion of the gate line 22. Accordingly, the gate pad delivers the signal to the gate line 22. The gate interconnection (22, 24) may include an auxiliary gate line (not shown) to prevent disconnection of the gate line 22. Therefore, the gate line 22 may be formed to have the structure of double wiring.

The gate interconnection (22, 24) may be made of an aluminum-based metal, such as aluminum (Al) and/or an aluminum alloy, a silver-based metal, such as silver (Ag) and/or a silver alloy, a copper-based metal, such as copper (Cu) and/or a copper alloy, a molybdenum-based metal, such as molybdenum (Mo) and/or a molybdenum alloy, chromium (Cr), titanium (Ti), or tantalum (Ta). Additionally, the gate interconnection (22, 24) may have a multilayered structure including two conductive layers having different physical properties (not shown). Of the two conductive layers, either conductive layer may be formed of metal having low resistivity, for example, the aluminum-based metal, the silver-based metal, or the copper-based metal, so as to reduce signal delay or a drop in voltage in the gate interconnection (22, 24). The other conductive layer may be formed of a substance having good contact properties with indium tin oxide (ITO) and indium zinc oxide (IZO), such as a molybdenum-based metal, chromium, titanium, or tantalum. With respect to the above-mentioned combination, a structure that includes a lower Cr layer and an upper Al layer, or a structure that includes a lower Al layer and an upper Mo layer may be formed, however, the present invention is not limited thereto. The gate interconnection (22, 24) may be made of various types of metals and conductors.

A gate insulation layer 30 is formed over the gate interconnection (22, 24). Here, the gate insulation layer 30 is formed on the entire surface of the substrate 10. The gate insulation layer 30 may be made of an inorganic insulating material such as silicon nitride ($SiN_x$) and/or silicon oxide ($SiO_2$). The gate insulation layer 30 may also be made of an organic insulating material such as benzocyclobutene (BCB) and/or acryl-based resin.

A semiconductor layer 40, which may be made of hydrogenated amorphous silicon and/or polycrystalline silicon, is formed on the gate insulation layer 30. The semiconductor layer 40 may have various shapes, such as island shapes or line shapes. In one embodiment, as shown in FIG. 1, the semiconductor layer 40 may be formed on the gate electrode 24 in an island shape. Where the semiconductor layer 40 has a line shape, it would be located under a data line 62 and extend over the gate electrode 24.

Ohmic contact layers (55, 56) which may be made of silicide or n+ hydrogenated amorphous silicon doped with a high concentration of n-type impurities may be formed on the semiconductor layer 40. The ohmic contact layers (55, 56) may have various shapes, such as island shapes or line shapes. Where the ohmic contact layers (55, 56) have an island shape, they would be located under a drain electrode 66 and a source electrode 65, respectively (FIG. 2). Where the ohmic contact layers (55, 56) have a line shape, they may extend down to the data line 62.

The data interconnection (62, 65 and 66) is formed over the substrate 10. The data interconnection includes the data line 62 crossing the gate line 22, the drain electrode 66 and the source electrode 65.

The data line 62 is formed over the gate insulation layer 30, and the source electrode 65 and the drain electrode 66 are formed over the ohmic contact layers 55 and 56.

The data line 62 crosses the gate line 22 to define a pixel. Here, an active X-ray detector substrate has a thin film transistor $T_1$ formed at an intersection area of the data line 62 and the gate line 22. Meanwhile, a data pad (not shown) is formed at an end of the data line 62. The data pad receives a data signal provided from another layer or an external circuit and transmits the data signal to the data line 62. The data pad has an expanded width for being connected with an external circuit.

The source electrode 65 is branched from the data line 62 to extend over the semiconductor 40.

The drain electrode 66 is separated from the source electrode 65. In addition, the source electrode 65 overlaps at least partially with the semiconductor 40. The drain electrode 66 includes a bar-shaped pattern on the semiconductor layer 40, and has an increased area due to a portion of it extending from the bar-shaped pattern. In one embodiment of the present invention, the drain electrode 66 is connected to the first electrode 68, the first electrode 68 may be patterned to extend from the drain electrode 66, and the drain electrode 66 and the first electrode 68 may be integrally formed.

The drain electrode 66 is formed to face the source electrode 65 across the gate electrode 24 and overlaps at least partially with the semiconductor layer 40. Here, the ohmic contact layers 55 and 56 are interposed between the semiconductor layer 40 and the source electrode 65 and between the semiconductor layer 40 and the drain electrode 66 to reduce contact resistance therebetween.

The data interconnection (62, 65 and 66) may be made of refractory metal such as chromium, molybdenum or a molybdenum-based metallic material, tantalum, or titanium. In another embodiment, the data interconnection (62, 65 and 66) may have a multi-layered structure including a lower layer (not shown) that includes a refractory metal and an upper layer (not shown) that includes a low-resistivity material. Examples of the multi-layered structure include a double-layered structure having an upper Cr film and an lower Al film or a lower Al film and an upper Mo film, and a triple-layered structure having a lower Mo film, an intermediate Al film, and an upper Mo film.

The first electrode 68 is connected to the drain electrode 66. As described above, the first electrode 68 may be integrally formed with the drain electrode 66. Thus, the first electrode 68 may be made of the same material as the drain electrode 66. The first electrode 68 together with the photoconductor 70 and the second electrode 80 forms a photodiode.

The passivation layers 75 and 76 are formed over the gate line 22, the data line 62, the thin film transistor $T_1$ and the first electrode 68. The passivation layers 75 and 76 insulate the gate line 22, the data line 62 and the thin film transistor $T_1$ from the photoconductor 70.

Upon absorption of light, current is generated in the photoconductor 70. When some of the generated current leaks (to be hereinafter referred to as 'leakage current'), the gate line 22, the data line 62 and the thin film transistor $T_1$ may be adversely affected. For example, the thin film transistor $T_1$ may not function properly, or false information may be transmitted to external circuits through the data line 62. In order to avoid such a malfunction, the TFT array substrate includes the passivation layers 75 and 76.

In the conventional TFT array substrate for an X-ray detector, a predetermined gap is provided between the gate and data lines and the photoconductor to insulate the gate line and a data line from the photoconductor. Accordingly, "a dead space," a portion of the pixel that is not associated with the conversion of the light absorbed in each pixel of the X-ray detector into an electrical signal, is generated at pixels formed on the TFT array substrate. The dead space serves to insulate the gate and data lines from the photoconductor, which may, reduce the overall area of the photoconductor, thereby ultimately reducing the fill factor of the X-ray detector, which is defined as the area of the photoconductor. As the fill factor is reduced, the sensitivity of the X-ray detector is reduced accordingly.

According to one embodiment of the present invention, in order to insulate the gate line 22 and the data line 62 from the photoconductor 70, the passivation layers 75 and 76, are formed, as described above, instead of providing a predetermined gap. In addition, after forming the passivation layers 75 and 76, the photoconductor 70 can be formed on the passivation layers 75 and 76, which increases the area of the photoconductor 70, thereby reducing the overall dead space, compared to the case of the conventional TFT array substrate.

Therefore, since the photoconductor 70 of the TFT array substrate for an X-ray detector has a wider area than that of the conventional photoconductor, the fill factor of the X-ray detector can be increased, thereby improving the sensitivity of the X-ray detector.

The passivation layers 75 and 76 may be made of inorganic insulating material such as silicon nitride ($SiN_x$) and/or silicon oxide ($SiO_2$). The passivation layers 75 and 76 may also be made of an organic insulating material such as benzocyclobutene (BCB) and/or acryl-based resin.

Figure 10A:
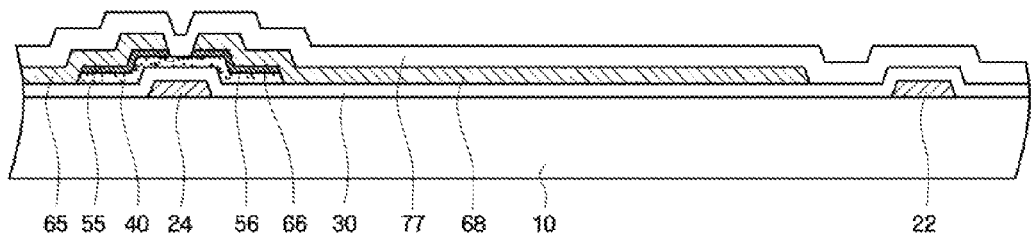
Figure 10B:
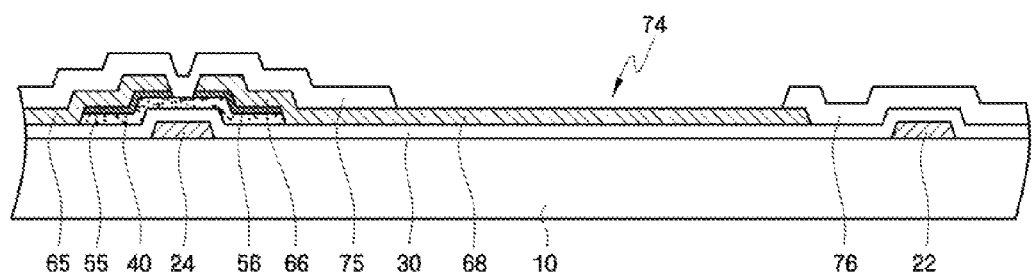

Meanwhile, a first contact hole 74, as shown in FIG. 10B is formed on the passivation layers 75 and 76 to electrically connect the first electrode 68 to the photoconductor 70.

The photoconductor 70 is formed over the passivation layers 75 and 76 and the first electrode 80. The photoconductor 70 includes a first silicon layer 71 with n-type impurities, an undoped second silicon layer 72, and a third silicon layer 73 with p-type impurities. Here, the first, second and third silicon layers 71, 72 and 73 may be made of amorphous silicon.

The electrons generated in the second silicon layer 72 move into the first silicon layer 71 and are then transmitted to the first electrode 68.

The second silicon layer 72 functions as a light absorbing layer that absorbs light to generate electron-hole pairs. Therefore, light is converted into electrical signals in the second silicon layer 72. The second silicon layer 72 is formed to have a thickness of about 1 micrometer (µm) or greater. Therefore, even if the bottom surface of the second silicon layer 72 that is in contact with the first silicon layer 71 is uneven, the unevenness generally ranges from about 100 to 200 nanometers (nm), suggesting that the top surface of the second silicon layer 72 seems substantially even.

The holes generated in the second silicon layer 72 move into the third silicon layer 73, which prevent the electrons from being induced into the photoconductor 70. Therefore, leakage current can be avoided. The photoconductor 70 is connected to the first electrode 68. In addition, since the first electrode 68 is connected to the drain electrode 66 of the thin film transistor T1, the electrical signals generated from the photoconductor 70 are transmitted to the thin film transistor T1 via the first electrode 68.

Since light is absorbed in the second silicon layer 72 to generate electron-hole pairs, the performance of the X-ray detector is not affected by the boundary of the first silicon layer 71, as indicated by S1-S1' in FIGS. 3 and 4. Thus, the boundary of the first silicon layer 71, i.e., S1-S1', may be located within the boundary of the second silicon layer 72, i.e., S2-S2'. When the boundary of the second silicon layer 72 is overlapping the boundary of the third silicon layer 73, the boundary of the first silicon layer 71 may be located within the boundary of the third silicon layer 73 formed on the second silicon layer 72. Here, the photoconductor 70 may be formed to extend over the thin film transistor $T_1$.

Next, locations of the photoconductor 70 in a pixel will be described with reference to FIGS. 3 and 4. As described above, the photoconductor 70 may be formed on the passivation layers 75 and 76, thereby minimizing the dead space of the photoconductor 70 in the pixel.

As shown in FIG. 3, one width of a pixel may correspond to a space between adjacent gate lines 22 on the substrate 10 in a direction in which the gate line 22 extends. Accordingly, in order to minimize the dead space while maximizing the area of the photoconductor 70 in the direction in which the gate line 22 on the substrate 10 extends, a first boundary of the photoconductor 70, as indicated by b1-b1' in FIG. 3, should be located between one end of the gate line 22 and one end of the adjacent gate line 22. In addition, the first boundary of the photoconductor 70, i.e., b1-b1', should be located outside the boundary of the first electrode 68. Here, the distance between one of the gate lines 22 and the first boundary of the photoconductor 70, i.e. b1-b1', may be shorter than the distance between the boundary of the first electrode 68 and the first boundary of the photoconductor 70, i.e. b1-b1'. In addition, the first boundary of the photoconductor 70, i.e. b1-b1' may be formed adjacent to one end of the gate line 22, so that the dead space may become equal to the width Wg of the gate line 22.

As shown in FIG. 4, the width in a pixel may also correspond to a space between adjacent data lines 62 on the substrate 10 in a direction in which the data line 62 extends. Accordingly, in order to minimize the dead space while maximizing the area of the photoconductor 70 in the direction in which the data line 62 on the substrate 10 extends, a second boundary of the photoconductor 70, as indicated by b2-b2' in FIG. 4, should be located between one end of the data line 62 and one end of the adjacent data line 62. In addition, the second boundary of the photoconductor 70, i.e. b2-b2', should be located outside the boundary of the first electrode 68. Here, the distance between one end of the data line 62 and the second boundary of the photoconductor 70, i.e. b2-b2', may be shorter than the distance between the boundary of the first electrode 68 and the second boundary of the photoconductor 70, i.e. b2-b2'. In addition, the second boundary of the photoconductor 70, i.e. b2-b2', may be formed to be adjacent with one end of the data line 62, so that the dead space may become equal to the width Wd of the data line 62.

In other words, the width Wg of the gate line 22 and the width Wd of the data line 62 exist as the dead space by forming the passivation layers 75 and 76. Therefore, the overall area of the photoconductor 70 is increased, thereby increasing the fill factor of the TFT array substrate for an X-ray detector. Accordingly, a detective quantum efficiency (DQE) of a pixel is increased, so that the sensitivity of the X-ray detector is increased, thereby improving the overall performance of the X-ray detector.

The second electrode 80 is formed on the photoconductor 70. The holes generated from the photoconductor 70 are made to be electrically conductive in the second electrode 80 by a capacitor (not shown). The second electrode 80 is made of a transparent conductive material, such as indium tin oxide (ITO) or indium zinc oxide (IZO) to allow light to be incident into the photoconductor 70.

The first electrode 68, the photoconductor 70 and the second electrode 80 form a PIN photodiode.

The planarization layer 90 is formed over the passivation layers 75 and 76 and the second electrode 80. The planarization layer 90 may be made of an organic or inorganic insulating material having a low dielectric index of about 4.0 or less. Here, the planarization layer 90 is preferably formed to a thickness of about 1 μm or greater in order to offset a step height derived from the PIN photodiode (68, 70, 80) and the thin film transistor $T_1$. If the thickness of the planarization layer 90 is less than about 1 μm, thin film characteristics of other layers formed over the planarization layer 90 may be degraded.

A second contact hole 101 is formed in the planarization layer 90.

A bias line 104 is formed over the planarization layer 90. In addition, the bias line 104 is electrically connected to the second electrode 80 through the second contact hole 101. The bias line 104 is formed on the substrate 10 and extends substantially parallel with the data line 62. The bias line 104 allows a bias voltage to be applied to the second electrode 80 to control the electrons or holes generated in the photoconductor 70. The optimal bias voltage to be applied to the second electrode 80 is approximately 5 V.

Figure 5:
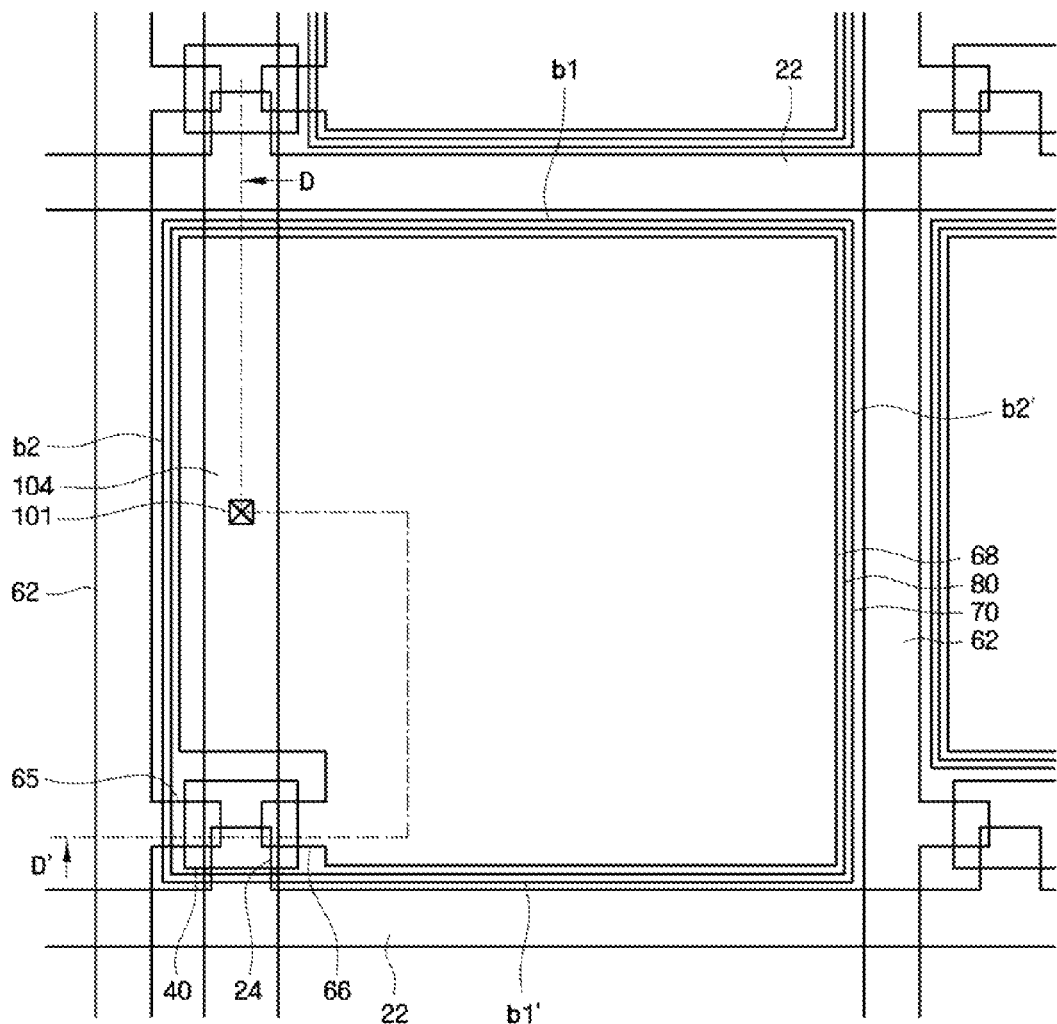
FIG. 5 is a layout view of a TFT array substrate for an X-ray detector according to another embodiment of the present invention.
Figure 6:
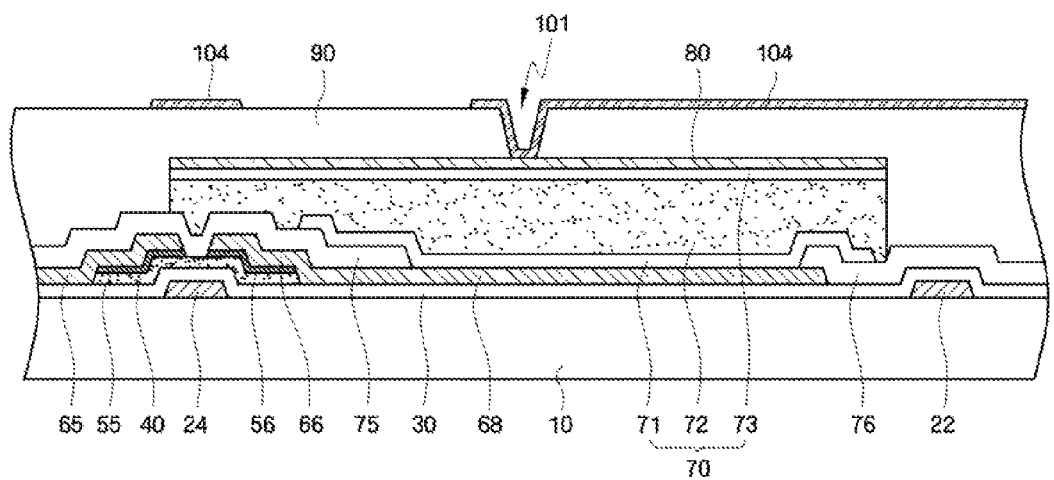
FIG. 6 is a cross-sectional view taken along line D-D' of FIG. 5.

FIG. 5 is a layout view of a TFT array substrate for an X-ray detector according to another embodiment of the present invention, and FIG. 6 is a cross-sectional view taken along line D-D' of FIG. 5. For the convenience of explanation, components each having the same function for describing the first embodiment shown in FIGS. 1 through 4 are respectively identified by the same reference numerals and their repetitive description will be omitted. The TFT array substrate for an X-ray detector according to this embodiment shown in FIGS. 5 and 6 is substantially the same as previously described above, except that a photoconductor 70 is formed to extend over a thin film transistor $T_1$, which is achieved by forming passivation layers 75 and 76 over the thin film transistor $T_1$, as described above. According to this embodiment, the dead space in a pixel can be noticeably reduced.

Another embodiment of the present invention will be described with reference to FIGS. 7A through 12B. FIGS. 7A, 8A, 9A, 11A and 12A are layout views of intermediate structures resulting from the fabricating of a TFT array substrate for an X-ray detector, and FIGS. 7B, 8B, 9B-10B, 11B and 12B are cross-sectional views taken along line A-A' of corresponding FIGS. 7A, 8A, 9A, 11A and 12A.

Figure 7A:
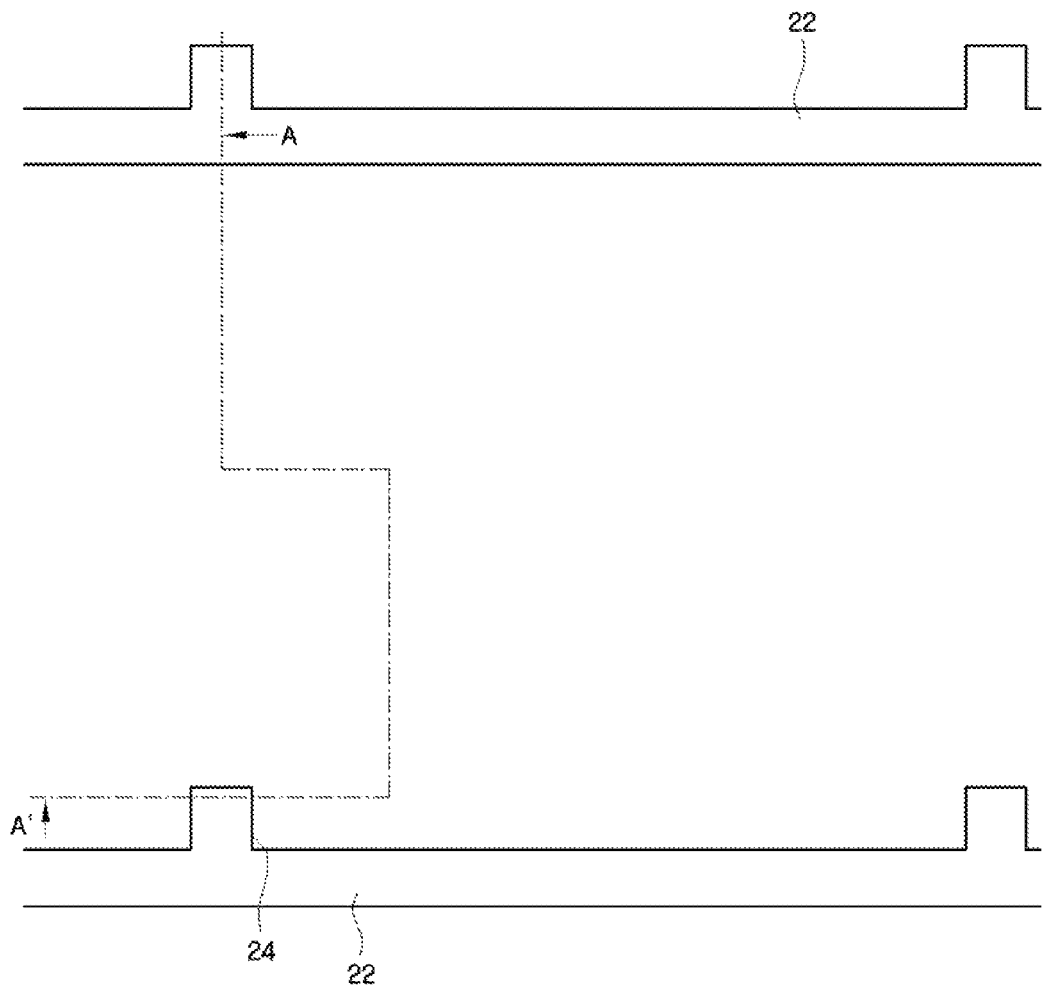
FIGS. 7A, 8A, 9A, 11A and 12A are layout views of intermediate structures of a TFT array substrate in the course of fabricating a TFT array substrate for an X-ray detector according to a another embodiment of the present invention, and 7B, 8B, 9B-10B, 11B and 12B are cross-sectional views taken along lines A-A' of FIGS. 7A, 8A, 9A, 11A and 12A, respectively.
Figure 7B:
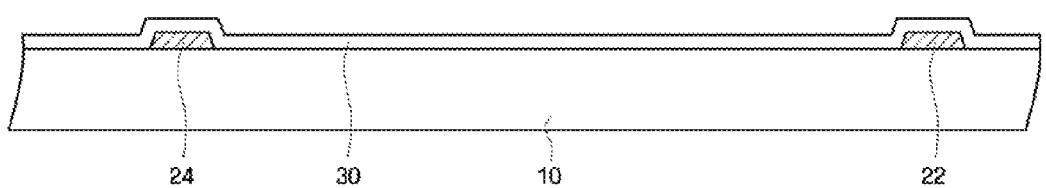

In FIGS. 7A and 7B, sputtering is performed in a sputtering chamber, the process including placing a low-resistivity target made of aluminum-neodymium (Al—Nd) alloy on the substrate 10 with the aid of the flow of argon gas.

As a result, a conductive film for forming a gate interconnection (22, 24), which is made of Al—Nd alloy, is deposited on a substrate 10 to a thickness of approximately 250 nm. Thereafter, the conductive film is patterned to form the gate interconnection (22, 24) extending on the substrate 10 in a predetermined direction. Here, the gate interconnection (22, 24) includes a gate line 22 and a gate electrode 24.

Figure 8A:
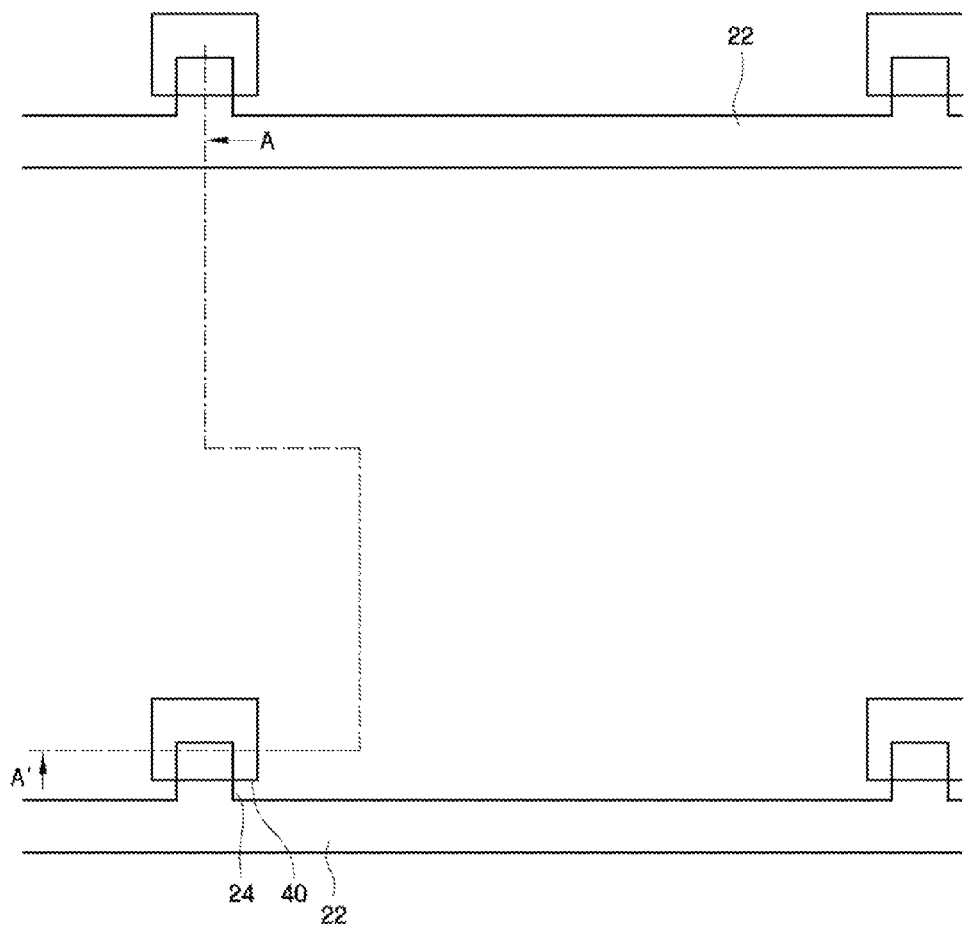
Figure 8B:
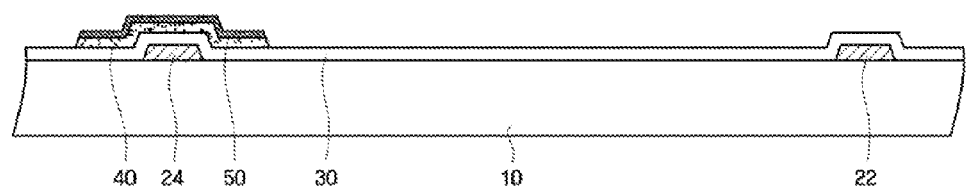

As shown in FIGS. 8A and 8B, three layers consisting of a gate insulation layer 30, a semiconductor layer 40 which may be made of amorphous silicon and a doped amorphous silicon layer 50 are sequentially stacked to form a triple-layered structure. Next, the semiconductor layer 40 and the doped amorphous silicon layer 50 are patterned by a patterning process using a mask, which is know to those having ordinary skill in the art. As a result, the semiconductor layer 40 and the doped amorphous silicon layer 50 are formed over the gate insulation layer 30 facing the gate electrode 24.

Figure 9A:
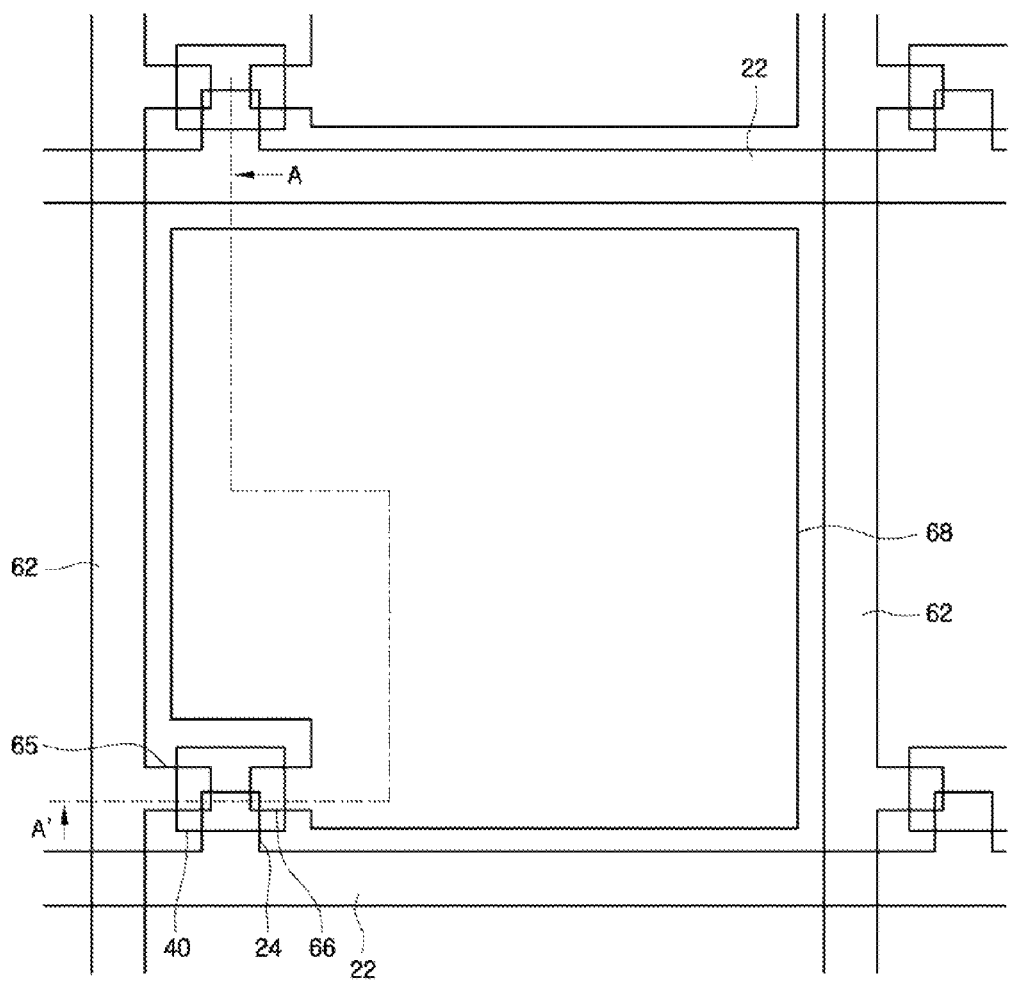
Figure 9B:
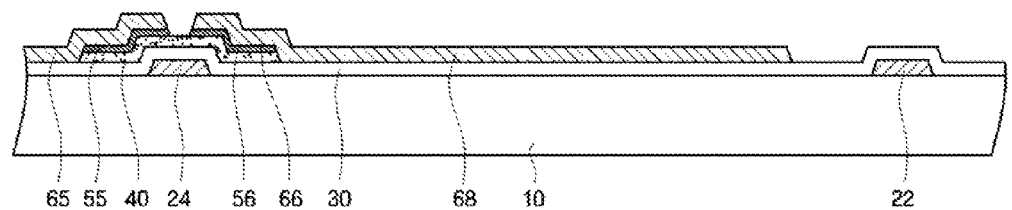

As shown in FIGS. 9A and 9B, a conductive film for forming a data interconnection (62, 65 and 66), which may be made of molybdenum (Mo), molybdenum-tungsten (Mo—W) alloy, chrome (Cr), or Al—Nd alloy, is deposited on the resultant structure to a thickness of approximately 250 nm. Thereafter, the conductive film is patterned by a photolithography process using a mask, which is known to those having ordinary skill in the art, to form a data interconnection (62, 65 and 66) extending on the substrate 10 to cross the gate lines 22.

The data interconnection (62, 65 and 66) is formed, including a data line 62, a source electrode 65 connected to the data line 62 and extending over the gate electrode 24, and a drain electrode 66 separated from the source electrode 65 and facing the source electrode 65 across the gate electrode 24. A first electrode 68 of a PIN photodiode (68, 70, 80) connected to the drain electrode 66 may be formed simultaneously with the drain electrode 66. Therefore, the first electrode 68 may be integrally formed with the drain electrode 66.

Next, the doped amorphous silicon layer 50 that is neither covered by the source electrode 65 nor the drain electrode 66 is etched, thereby separating the source electrode 65 and the drain electrode 66 in opposite directions across the gate electrode 24. As a result, ohmic contact layers 55 and 56 are formed, and the semiconductor layer 40 between the ohmic contact layers 55 and 56 is exposed. Then, a thin film transistor T1 including the gate electrode 24, the source electrode 65 and the drain electrode 66 is completed.

As shown in FIG. 10A, a passivation layer 77 is formed over the gate line 22, the data line 62 (not shown), the source electrode 65, the drain electrode 66 and the first electrode 68. As shown in FIG. 10B, a first contact hole 74 is formed in the passivation layer 75 and 76 to expose the first electrode 68.

Figure 11A:
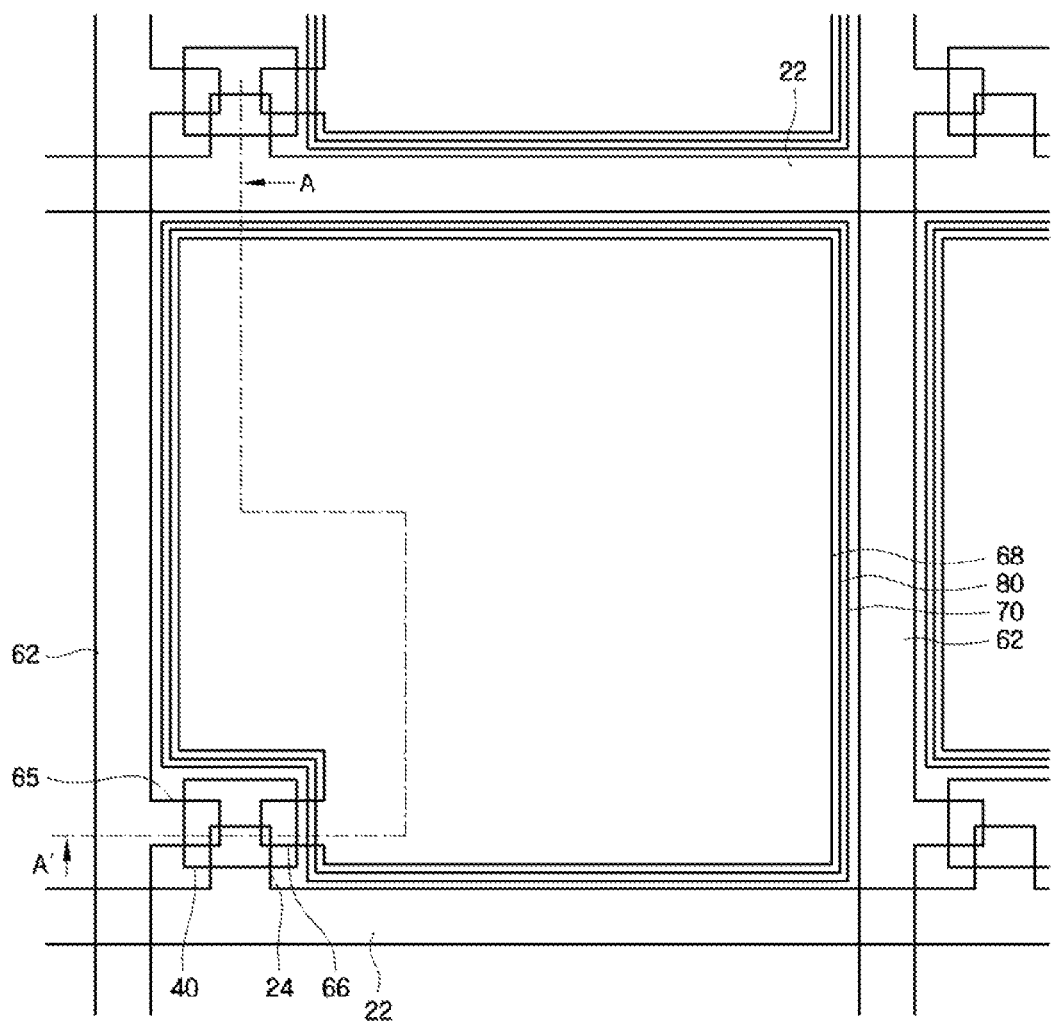
Figure 11B:
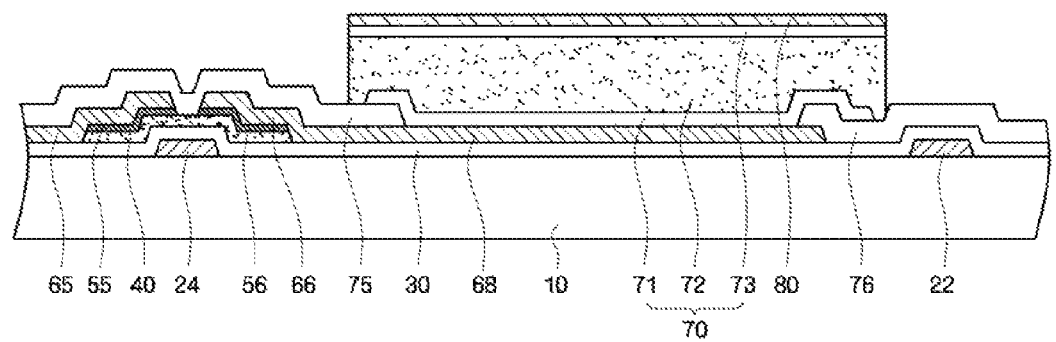

As shown in FIGS. 11A and 11B, a photoconductor 70 is formed over passivation layers 75 and 76 and the first electrode 68 that is exposed by the first contact hole 74 in the passivation layers 75 and 76. As a result, the first electrode 68 and the photoconductor 70 are connected to each other.

The photoconductor 70 is formed by sequentially stacking a first silicon layer 71 doped with n-type impurities, an undoped second silicon layer 72, and a third silicon layer 73 with p-type impurities. Here, the boundary of the first silicon layer 72 may be formed to be located within the boundary of the undoped second silicon layer 72 or the boundary of the third silicon layer 73.

As described above, a first boundary of the photoconductor 70, as indicated by b1-b1' in FIG. 3, may be formed to be located between one end of the gate line 22 and one end of the adjacent gate line 22. Here, the first boundary of the photoconductor 70, i.e., b1-b1', may be located outside the boundary of the first electrode 68.

In addition, a second boundary of the photoconductor 70, as indicated by b2-b2' in FIG. 4, may be formed to be located between one end of the data line 62 and one end of the adjacent data line 62. Here, the second boundary of the photoconductor 70, i.e. b2-b2', may be located outside the boundary of the first electrode 68. Next, as shown in FIGS. 11A and 11B, a conductive material such as IZO or ITO is deposited and patterned using a mask to form a second electrode 80 of a PIN photodiode (68, 70, 80), as known to those having ordinary skill in the art. As a result, the PIN photodiode (68, 70, 80), including the first electrode 68, the photoconductor 70 and the second electrode 80, is complete.

Figure 12A:
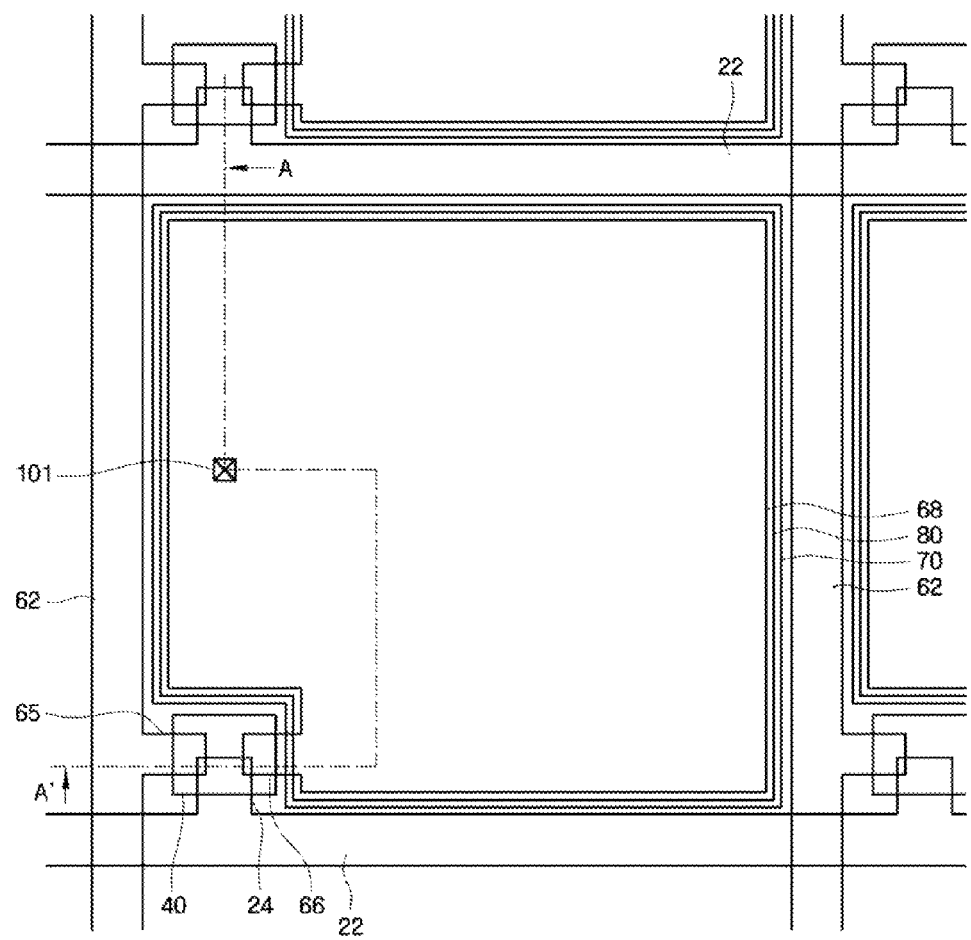
Figure 12B:
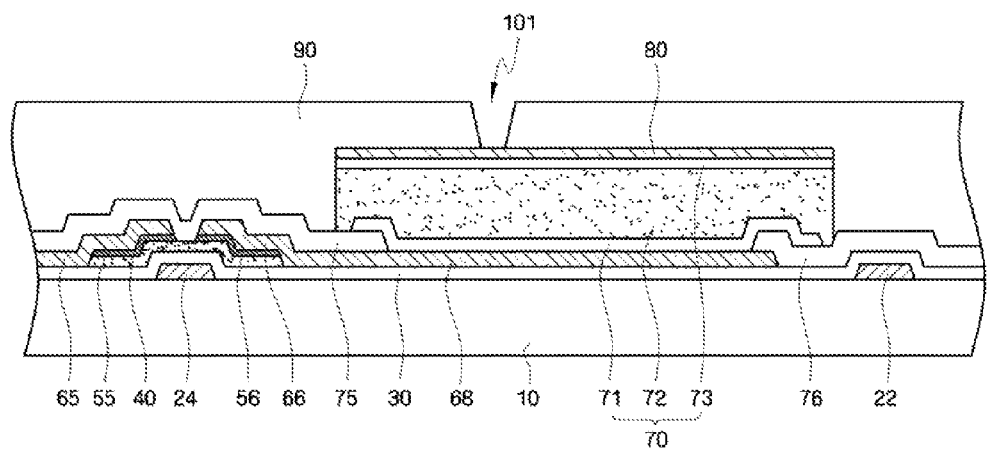

Next, as shown in FIGS. 12A and 12B, a planarization layer 90 is formed by chemical vapor deposition (CVD) using trimethyl silane. Thereafter, a second contact hole 101 exposing the second electrode 80 and the source electrode 65 is formed by a photolithography process using a mask, which is known to those having ordinary skill in the art.

Then, as shown in FIGS. 1 and 2, a conductive film for forming an interconnection is stacked on the planarization layer 90 and patterned to form a bias line 104 connected to the second electrode 80 through the second contact hole 101 and extending to be parallel with the data line 62.

While the present invention has been particularly shown and described with reference to embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A thin film transistor (TFT) array substrate for an X-ray detector comprising:
    a substrate;
    a gate line formed on the substrate;
    a data line crossing the gate line;
    a thin film transistor including a gate electrode, a source electrode, and a drain electrode;
    a first electrode connected to the drain electrode;
    a passivation layer formed over the gate line, the data line, the thin film transistor and the first electrode;
    a photoconductor formed over the passivation layer and connected to the first electrode; and
    a second electrode formed on the photoconductor,
    wherein the photoconductor comprises a first silicon layer with n-type impurities, an undoped second silicon layer, and a third silicon layer with p-type impurities,
    wherein the first, second and third silicon layers are sequentially disposed, and
    wherein a bottom surface of the undoped second silicon layer contacts the passivation layer.

2. The TFT array substrate of claim 1, further comprising a planarization layer formed over the passivation layer and the second electrode.

3. The TFT array substrate of claim 2, further comprising a bias line formed over the planarization layer and connected to the second electrode.

4. The TFT array substrate of claim 1, wherein the photoconductor comprises a first silicon layer with n-type impurities, an undoped second silicon layer, and a third silicon layer with p-type impurities, the first, second and third silicon layers sequentially formed.

5. The TFT array substrate of claim 4, wherein a boundary of the first silicon layer is located within a boundary of the second silicon layer.

6. The TFT array substrate of claim 1, wherein the photoconductor is formed to extend over the thin film transistor.

7. The TFT array substrate of claim 5, wherein the photoconductor is formed to extend over the thin film transistor.

8. The TFT array substrate of claim 1, wherein a first boundary of the photoconductor is located between a first end of the gate line and a first end of an adjacent gate line, the first boundary of the photoconductor located outside a boundary of the first electrode.

9. The TFT array substrate of claim 8, wherein the distance between the first end of the gate line and the first boundary of the photoconductor is shorter than that between the boundary of the first electrode and the first boundary of the photoconductor.

10. The TFT array substrate of claim 8, wherein the photoconductor includes a first silicon layer with n-type impurities, an undoped second silicon layer, and a third silicon layer with p-type impurities, the first, second and third silicon layers sequentially formed, and a boundary of the first silicon layer located within a boundary of the second silicon layer.

11. The TFT array substrate of claim 8, wherein the photoconductor is formed to extend over the thin film transistor.

12. The TFT array substrate of claim 1, wherein a first boundary of the photoconductor is located between a first end of the data line and a first end of an adjacent data line, the first boundary of the photoconductor located outside a boundary of the first electrode.

13. The TFT array substrate of claim 12, wherein a distance between the first end of the data line and the first boundary of the photoconductor is shorter than that between the boundary of the first electrode and the first boundary of the photoconductor.

14. The TFT array substrate of claim 12, wherein the photoconductor includes a first silicon layer with n-type impurities, an undoped second silicon layer, and a third silicon layer with p-type impurities, the first, second and third silicon layers sequentially formed, and a boundary of the first silicon layer is located within a boundary of the second silicon layer.

15. The TFT array substrate of claim 1, wherein the photoconductor overlaps at least a portion of the passivation layer and overlaps the first electrode, the portion of the passivation layer being disposed between the photoconductor and the first electrode.

16. A method of fabricating a thin film transistor (TFT) array substrate for an X-ray detector, the method comprising:
providing a substrate;
forming a gate line and a gate electrode on the substrate;
forming a data line crossing the gate line, a source electrode, and a drain electrode on the substrate;
forming a first electrode on the substrate to be connected to the drain electrode;
forming a passivation layer over the gate line, the data line, the source electrode, the drain electrode, and the first electrode;
forming a first contact hole on the passivation layer;
forming a photoconductor over the passivation layer and the first electrode exposed by the first contact hole; and
forming a second electrode on the photoconductor,
wherein the photoconductor comprises a first silicon layer with n-type impurities, an undoped second silicon layer, and a third silicon layer with p-type impurities,
wherein the first, second and third silicon layers are sequentially disposed, and
wherein a bottom surface of the undoped second silicon layer contacts the passivation layer.

17. The method of claim 16, wherein the first electrode is formed at the same time as the drain electrode.

18. The method of claim 16, further comprising forming a planarization layer over the passivation layer and the second electrode.

19. The method of claim 18, further comprising:
forming a second contact hole over the planarization layer, and
forming a bias line over the planarization layer that is connected to the second electrode through the second contact hole.

20. The method of claim 16, wherein the forming of the photoconductor comprises sequentially stacking a first silicon layer with n-type impurities, an undoped second silicon layer, and a third silicon layer with p-type impurities, and
wherein a boundary of the first silicon layer is located within a boundary of the second silicon layer.

* * * * *